United States Patent
Sugar et al.

(10) Patent No.: US 6,785,520 B2
(45) Date of Patent: Aug. 31, 2004

(54) SYSTEM AND METHOD FOR ANTENNA DIVERSITY USING EQUAL POWER JOINT MAXIMAL RATIO COMBINING

(75) Inventors: Gary L. Sugar, Rockville, MD (US); Chandra Vaidyanathan, Bethesda, MD (US)

(73) Assignee: Cognio, Inc., Gaithersburg, MD (US)

(*) Notice: Subject to any disclaimer, the term of this patent is extended or adjusted under 35 U.S.C. 154(b) by 66 days.

(21) Appl. No.: 10/174,689

(22) Filed: Jun. 19, 2002

(65) Prior Publication Data

US 2004/0072546 A1 Apr. 15, 2004

Related U.S. Application Data

(60) Provisional application No. 60/380,139, filed on May 6, 2002, provisional application No. 60/365,797, filed on Mar. 21, 2002, and provisional application No. 60/361,055, filed on Mar. 1, 2002.

(51) Int. Cl.[7] .................................................. H04B 1/38
(52) U.S. Cl. ...................... 455/101; 455/272; 455/334; 455/276.1; 455/522; 455/562.1; 375/299; 375/347
(58) Field of Search ............................ 455/101, 127.1, 455/137, 269, 272, 334, 276.1, 562.1, 522; 375/299, 347, 144, 260

(56) References Cited

U.S. PATENT DOCUMENTS

| | | | |
|---|---|---|---|
| 4,599,734 A | 7/1986 | Yamamoto | 375/40 |
| 4,639,914 A | 1/1987 | Winters | 370/110.1 |
| 5,274,844 A | 12/1993 | Harrison et al. | 455/25 |
| 5,394,435 A | 2/1995 | Weerackody | 375/206 |
| 5,437,055 A | 7/1995 | Wheatley, III | 455/33.3 |
| 5,491,723 A | 2/1996 | Diepstraten | 375/267 |
| 5,507,035 A | 4/1996 | Bantz et al. | 455/133 |
| 5,577,265 A | 11/1996 | Wheatley, III | |
| 5,982,327 A | 11/1999 | Vook et al. | 342/380 |
| 6,008,760 A | 12/1999 | Shattil | |
| 6,037,898 A | 3/2000 | Parish et al. | 342/174 |
| 6,038,272 A | 3/2000 | Golden | |
| 6,044,120 A | 3/2000 | Bar-David et al. | |
| 6,058,105 A | 5/2000 | Hochwald et al. | |
| 6,097,771 A | 8/2000 | Foschini | |
| 6,122,260 A | 9/2000 | Liu et al. | 370/280 |
| 6,124,824 A | 9/2000 | Xu et al. | 342/174 |
| 6,141,393 A | 10/2000 | Thomas et al. | 375/347 |
| 6,144,711 A | 11/2000 | Raleigh et al. | |
| 6,147,985 A | 11/2000 | Bar-David et al. | |
| 6,157,340 A | 12/2000 | Xu et al. | 342/174 |
| 6,177,906 B1 | 1/2001 | Petrus | 342/378 |
| 6,195,045 B1 | 2/2001 | Xu et al. | 342/368 |
| 6,211,671 B1 | 4/2001 | Shattil | |
| 6,252,548 B1 | 6/2001 | Jeon | |

(List continued on next page.)

FOREIGN PATENT DOCUMENTS

| | | | |
|---|---|---|---|
| EP | 1158716 A2 * | 11/2001 | H04L/1/06 |
| WO | WO 02/03568 | 1/2002 | |
| WO | WO 01/45300 | 6/2002 | |

OTHER PUBLICATIONS

Wolniansky et al. "V–Blast: An Architecture for realizing Very High Data Rates Over the Rich Scattering Wireless Channel," Proc. ISSSE–98, Pisa, Italy, Sep. 29, 1998.*

(List continued on next page.)

Primary Examiner—Edward F. Urban
Assistant Examiner—Blane J. Jackson
(74) Attorney, Agent, or Firm—D. Andrew Floam, Esq.

(57) ABSTRACT

An equal gain composite beamforming technique which constrains that the power of the signal output by each antenna is the same, and is equal to the total power of the transmit signal divided by the number N of transmit antennas from which the signal is to be transmitted. By reducing output power requirements for each power amplifier, the silicon area of the power amplifiers are reduced by as much as N times (where N is equal to the number of transmit antennas) relative to a non-equal gain CBF.

61 Claims, 11 Drawing Sheets

U.S. PATENT DOCUMENTS

| | | | |
|---|---|---|---|
| 6,307,882 B1 | 10/2001 | Marzetta | |
| 6,317,466 B1 | 11/2001 | Foschini et al. | |
| 6,327,310 B1 | 12/2001 | Hochwald et al. | |
| 6,331,837 B1 | 12/2001 | Shattil | |
| 6,349,219 B1 | 2/2002 | Hochwald et al. | |
| 6,351,499 B1 | 2/2002 | Paulraj et al. | |
| 6,369,758 B1 | 4/2002 | Zhang | 342/383 |
| 6,442,214 B1 | 8/2002 | Boleskei et al. | |
| 6,462,709 B1 | 10/2002 | Choi | 342/378 |
| 6,463,295 B1 | 10/2002 | Yun | 455/522 |
| 6,473,467 B1 * | 10/2002 | Wallace et al. | 375/267 |
| 6,584,161 B2 | 6/2003 | Hottinen et al. | 375/299 |
| 6,636,568 B2 * | 10/2003 | Kadous | 375/225 |
| 2001/0012764 A1 | 8/2001 | Edwards et al. | |
| 2001/0015994 A1 | 8/2001 | Nam | |
| 2001/0046255 A1 | 11/2001 | Shattil | |
| 2001/0053143 A1 | 12/2001 | Li et al. | |
| 2002/0001316 A1 | 1/2002 | Hornsby et al. | 370/487 |
| 2002/0024975 A1 | 2/2002 | Hendler | |
| 2002/0064246 A1 | 5/2002 | Kelkar et al. | 375/347 |
| 2002/0072392 A1 | 6/2002 | Awater et al. | 455/561 |
| 2002/0122501 A1 | 9/2002 | Awater et al. | 375/262 |
| 2002/0136170 A1 | 9/2002 | Struhsaker et al. | 370/280 |
| 2002/0141355 A1 | 10/2002 | Struhsaker et al. | 370/280 |
| 2002/0196842 A1 | 12/2002 | Onggosanusi et al. | 375/148 |
| 2003/0002450 A1 | 1/2003 | Jalali et al. | 370/294 |
| 2003/0032423 A1 | 2/2003 | Boros et al. | 455/423 |
| 2003/0108117 A1 | 6/2003 | Ketchum et al. | 375/295 |
| 2003/0125090 A1 | 7/2003 | Zeira | 455/562 |
| 2003/0139194 A1 | 7/2003 | Onggosanusi et al. | 455/506 |

OTHER PUBLICATIONS

Iserte, Antonio Pascual et al., "Pre–and Post–Beamforming in MIMO Channels Applied to HIPERLAN/2 and OFDM," IST Summit 2001 (IST Mobile Communications Summit), Sep., 2001.

Iserte, Antonio Pascual et al., "Joint Beamforming Strategies in OFDM–MIMO Systems," ICASSP 2002 (IEEE International Conference on Acoustics, Speech and Signal Processing), May, 2002.

Lee, Dennis et al., "Antenna Diversity for an OFDM System in a Fading Channel," Proceeding of IEEE MILCOM 1999, Nov., 1999, pp. 1104–1109.

Jakes, William C., "Microwave Mobile Communications," Copyright 1974, pp. 313–320 and 489–498.

Yeh, Y.S., "An Analysis of Adaptive Retransmission Arrays in a Fading Environment," The Bell System Technical Journal, Oct., 1970, pp. 1811–1825.

Morgan, Samuel P., "Interaction of Adaptive Antenna Arrays in an Arbitrary Environment," The Bell System Technical Journal, Jan., 1965, pp. 23–47.

Aziz, Abdul M.K. et al., "Indoor Throughput and Range Improvements using Standard Compliant AP Antenna Diversity in IEEE 802.11a and ETSI HIPERLAN/2," Vehicular Technology Conference, 2002, VTC 2001, Oct. 7–11, 2001, IEEE VTS $54^{th}$, vol. 4, pp. 2294–2298.

Iserte, Antonio Pascual et al., "Iterative Algorithm for the Estimation of Distributed Sources Localization Parameters," SSP 2001 ($11^{th}$ IEEE Workshop on Statistical Signal Processing), Aug., 2001.

Heath, Robert W., Jr., "A Simple Scheme for Transmit Diversity Using Partial Channel Feedback," Signals, Systems & Computers, Conference Record of the Thirty–Second Asilomar Conference Nov. 1–4, 1998, vol. 2, pp. 1073–1078.

Vaidyanathan et al., "The Role of Lossless Systems in Modern Digital Signal Processing: A Tutorial," IEEE Transactions on Education, vol. 32, Aug. 1989, pp. 181–197.

Raleigh et al., "Spatio–Temporal Coding for Wireless Communication," IEEE Transactions on Communications, vol. 46., No. 3, Mar. 1998, pp. 357–366.

Jungnickel et al., "Performance of a MIMO System with Overlay Pilots," IEEE GlobeCom 2001, pp. 594–598.

BLAST High–Level Overview, Lucent Technologies, Jul. 18, 2000.

Golden et al., "Detection Algorithm and Initial Laboratory Results Using V–BLAST space–time communication architecture," Electronic Letters, Jan. 7, 1999, vol. 35, No. 1.

Golden et al., "V–BLAST: A High Capacity Space–Time Architecture for the Rich–Scattering Wireless Channel," Bell Laboratories, Lucent Technologies, Proc. Int'l Symposium on Advanced Radio Technologies, Builder, CO, Sep. 10, 1998.

Wolniansky et al., "V–BLAST: An Architecture for Realizing Very High Data Rates Over the Rich–Scattering Wireless Channel," Proc. ISSSE–98, Pisa, Italy, Sep. 29, 1998.

Chizhik et al., "Keyholes, Correlations, and Capacities of Multielement Transmit and Receiver Antennas," IEEE Transactions on Wireless Communications, vol. 1, No. 2, Apr. 2002, pp. 361–368.

Junqiang et al., "Spatial Multiuser Access with MIMO Smart Antennas for OFDM Systems," IEEE VTC '2001, Sep., 2001, pp. 1553–1557.

Stridh et al., "MIMO Channel Capacity on a Measured Indoor Radio Channel at 5.8 GHz," Proc. Of the Asilomar Conf. on Signals, Systems & Computers, vol. 1, Oct., 2000, pp. 733–737.

Jungnickel et al., "A MIMO WLAN Based on Linear Channel Inversion," IEE Seminar–MIMO Communication Systems from Concept to Implementation, Dec., 2001, pp. 20/1–20/6.

Stridh et al., "Spatial Characterization of Indoor Radio Channel Measurements at 5GHz," SAM '2000, Mar., 2000, pp. 58–62.

Irner, Ralf et al., "MISO Concepts for Frequency–Selective Channels," 2002 International Zurich Seminar on Broadband Communications Access, Feb. 19–21, 2002.

Choi, Ruly Lai–U et al., "MISO CDMA Transmission with Simplified Receiver for Wireless Communication Handsets," IEEE Transactions on Communications, vol. 49, No. 5, May, 2002.

Meyer–Ottens, Sven et al., "Downlink Beamforming for W–CDMA Using Feedback and Interference Estimate," Mar. 9, 2001.

Brunner, Christopher et al., "Downlink Beamforming for WCDMA Based on Uplink Channel Parameters," Proc. EPMCC 1999, pp. 375–380, Mar. 1999.

Yang, Jian et al., "On Joint Transmitter and Receive Optimization for Multiple–Input–Multiple–Output (MIMO) Transmission Systems," IEEE Transactions on Communications, vol. 42, No. 12, Dec., 1994.

Ivrlac, Michel et al., "On Channel Capacity of Correlated MIMO Channels," ITG Fokusprojekt: Mobilkommunikation "Systeme mit intelligenten Antennen", Ilmenau, 2001.

Bablan et al., "Optimum Diversity Combining and Equalization in Digital Data Transmission with Applications to Cellular Mobile Radio–PartII: Numerical Results", May 1992, IEEE Transactions on Communications, vol. 30, No. 5, pp. 895–907.

Chuah et al., "Capacity of Multi–Antenna Array Systems in Indoor Wireless Environment", Nov. 1998, IEEE Globecom.

Wallace et al., "Experimental Characterization of the MIMO Wireless Channel: Data Acquisition and Analysis", Feb. 27, 2002, Department of Electrical and Computer Engineering, Brigham Young University.

Love et al., "Equal Gain Transmission in Multiple–Input Multiple–Output Wireless Systems", Nov. 2002, Proceedings of IEEE Globecom, pp. 1124–1128.

PCT Search Report from counterpart PCT application No. PCT/US03/05644 filed Feb. 26, 2003.

Specification and Allowed claims from related U.S. application No. 10/174,728 filed Jun. 19, 2002.

* cited by examiner

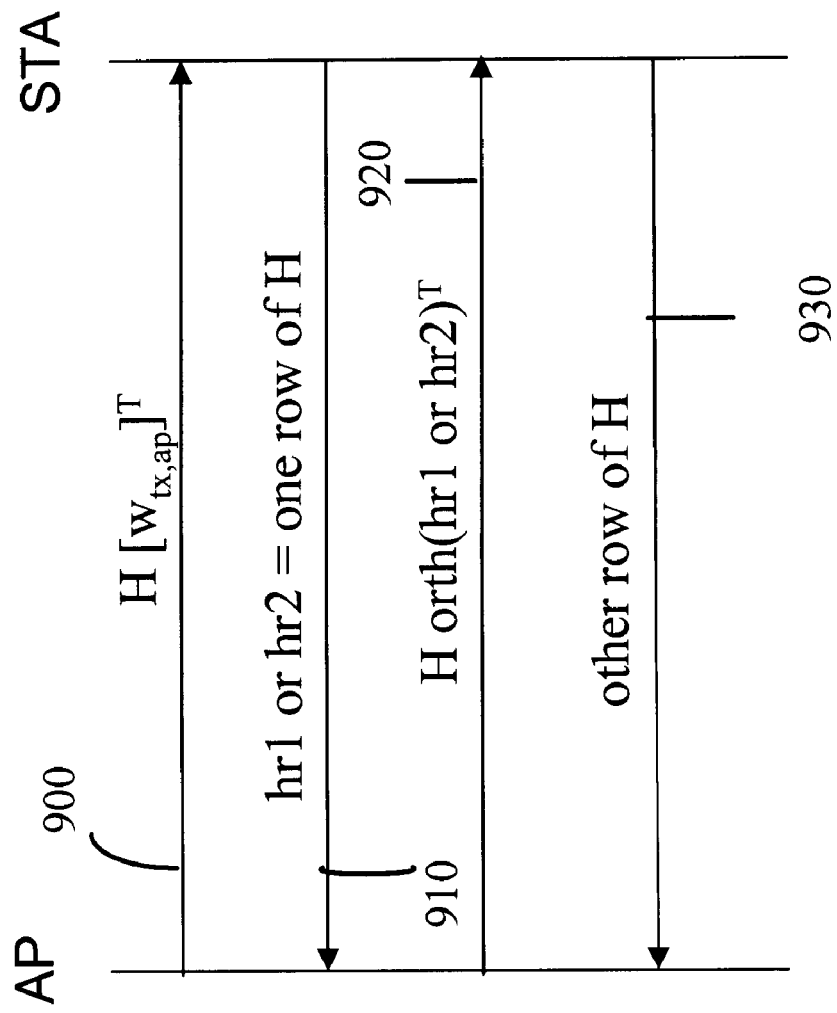

SYSTEM AND METHOD FOR ANTENNA DIVERSITY USING EQUAL POWER JOINT MAXIMAL RATIO COMBINING

This application claims priority to U.S. Provisional Application No. 60/361,055, filed Mar. 1, 2002, to U.S. Provisional Application No. 60/365,797 filed Mar. 21, 2002, and to U.S. Provisional Application No. 60/380,139, filed May 6, 2002, the entirety of all of which are incorporated herein by reference.

RELATED APPLICATIONS

This application is related to commonly assigned U.S. Non-Provisional Application No. Ser. 10/174,728, filed on even date, and entitled "SYSTEM AND METHOD FOR ANTENNA DIVERSITY USING JOINT MAXIMAL RATIO COMBINING."

BACKGROUND OF THE INVENTION

The present invention is directed to an antenna (spatial) processing useful in wireless communication applications, such as short-range wireless applications.

Composite Beamforming (CBF) is an antenna processing technique in which a first communication device, having a plurality of antennas, weights a signal to be transmitted by its antennas to a second communication device also having a plurality of antennas. Similarly, the second communication device weights and combines the received signals received by its antennas. A multiple-input/multiple-output (MIMO) optimized communication system is defined by CBF. The transmit weights and receive weights are determined to optimize the link margin between the devices, thereby significantly extending the range of communication between the two communication devices. Techniques related to composite beamforming are the subject matter of above-identified commonly assigned co-pending application.

There is room for still further enhancing this CBF technique to optimize cost and implementation issues at the expense of only slight degradation in performance. Such a solution is extremely valuable in manufacturing a cost-effective integrated circuit solution.

SUMMARY OF THE INVENTION

An equal gain composite beamforming technique is provided that adds the constraint that the power of the signal output by of the plurality of transmit antennas is the same, and is equal to the total power of the transmit signal divided by the number N of transmit antennas from which the signal is to be transmitted. This reduces output power requirements at each antenna. By reducing output power requirements for each power amplifier, the silicon area of the power amplifiers are reduced by as much as N times (where N is the number of transmit antennas) relative to non-equal gain CBF. Many implementation advantages are achieved by equal gain CBF, including savings in silicon, power requirements, etc.

The above and other objects and advantages will become more readily apparent when reference is made to the following description taken in conjunction with the accompanying drawings.

BRIEF DESCRIPTION OF THE DRAWINGS

FIG. 12 is a flow diagram for a process that is useful when one device on the communication link is composite beamforming capable and the other device uses antenna selection diversity capable.

DETAILED DESCRIPTION OF THE DRAWINGS

Figure 1:
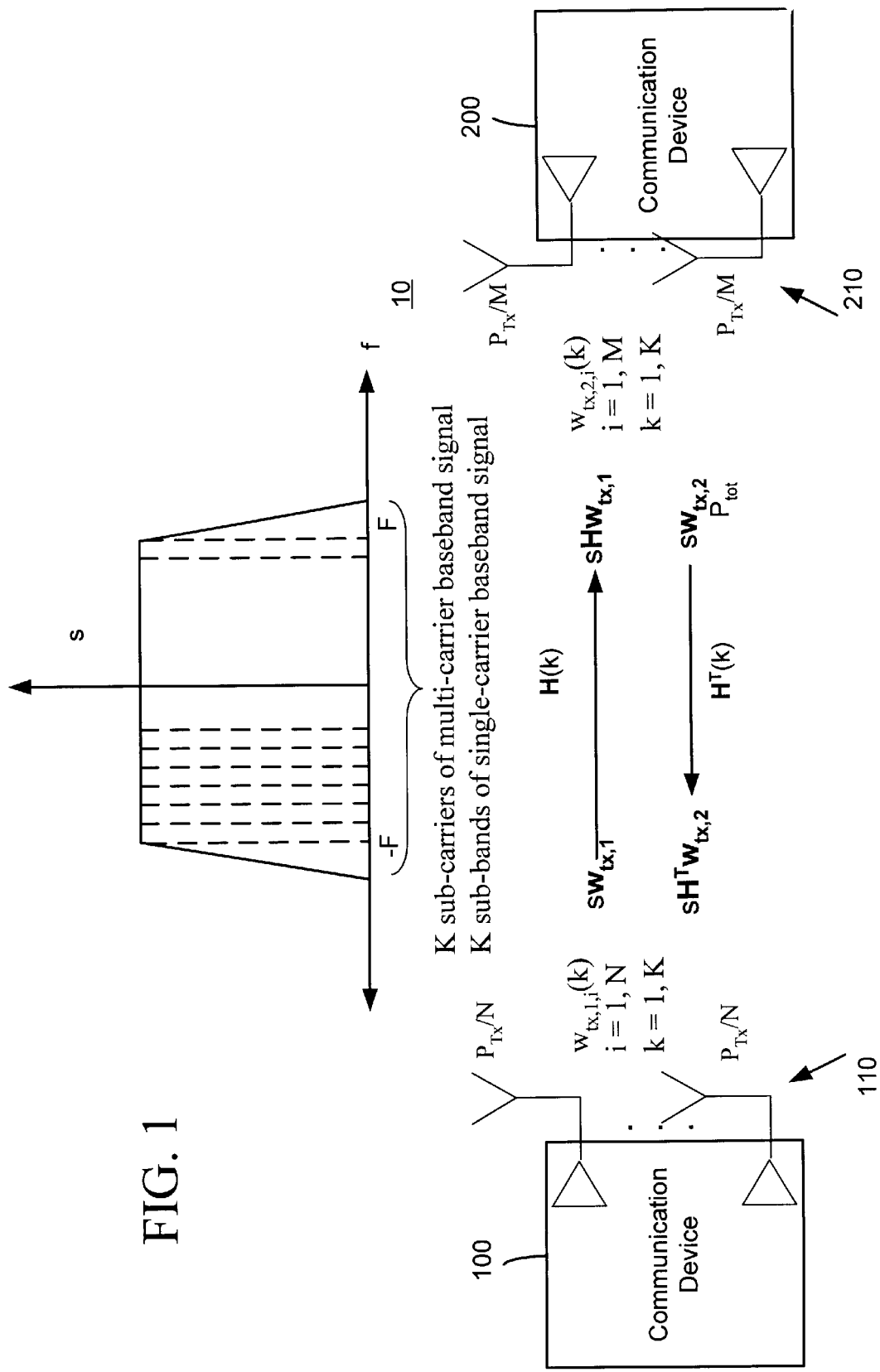
FIG. 1 is a block diagram of two communication devices performing equal gain composite beamforming.

Referring first to FIG. 1, a system 10 is shown in which a first communication device and a second communication device 200 communicate with each other using radio frequency (RF) communication techniques. The devices use composite beamforming techniques when communicating with each other. In particular, communication device 100 has N plurality of antennas 110 and communication device 200 has M plurality of antennas 210. According to the composite beamforming (CBF) technique also described in the aforementioned co-pending application filed on even date, when communication device 100 transmits a signal to communication device 200, it applies to (i.e., multiplies or scales) a baseband signal s to be transmitted a transmit weight vector associated with a particular destination device, e.g., communication device 200, denoted $w_{tx,1}$. Similarly, when communication device 200 transmits a baseband signal s to communication device 100, it multiplies the baseband signal s by a transmit weight vector $w_{tx,2}$, associated with destination communication device 100. The (M×N) frequency dependent channel matrix from the N plurality of antennas of the first communication device 100 to M plurality of antennas of the second communication device 200 is H(k), and the frequency dependent communication channel (N×M) matrix between the M plurality of antennas of the second communication device and the N plurality of antennas of the first communication device is $H^T(k)$.

The transmit weight vectors $w_{tx,1}$ and $w_{tx,1}$ each comprises a plurality of transmit weights corresponding to each of the N and M antennas, respectively. Each transmit weight is a complex quantity. Moreover, each transmit weight vector is frequency dependent; it may vary across the bandwidth of the baseband signal s to be transmitted. For example, if the baseband signal s is a multi-carrier signal of K sub-carriers, each transmit weight for a corresponding antenna varies across the K sub-carriers. Similarly, if the baseband signal s is a single-carrier signal (that can be divided or synthesized into K frequency sub-bands), each transmit weight for a corresponding antenna varies across the bandwidth of the baseband signal. Therefore, the transmit/weight vector is dependent on frequency, or varies with frequency sub-band/sub-carrier k, such that $w_{tx}$ becomes $w_{tx}(f)$, or more commonly referred to as $w_{tx}(k)$, where k is the frequency sub-band/sub-carrier index.

While the terms frequency sub-band/sub-carrier are used herein in connection with beamforming in a frequency dependent channel, it should be understood that the term "sub-band" is meant to include a narrow bandwidth of spectrum forming a part of a baseband signal. The sub-band may be a single discrete frequency (within a suitable frequency resolution that a device can process) or a narrow bandwidth of several frequencies.

The receiving communication device also weights the signals received at its antennas with a receive antenna weight vector $w_{rx}(k)$. Communication device 100 uses a receive antenna weight vector $w_{rx,1}(k)$ when receiving a transmission from communication device 200, and communication device 200 uses a receive antenna weight vector $w_{rx,2}(k)$ when receiving a transmission from communication device 100. The receive antenna weights of each vector are matched to the received signals by the receiving communication device. The receive weight vector may also be frequency dependent.

Generally, transmit weight vector $w_{tx,1}$ comprises a plurality of transmit antenna weights $w_{tx,1,i} = \beta_{1,i}(k) e^{j\phi_{1,i,(k)}}$, where $\beta_{1,i}(k)$ is the magnitude of the antenna weight, $\phi_{1,i,(k)}$ is the phase of the antenna weight, i is the antenna index, and k is the frequency sub-band or sub-carrier index (up to K frequency sub-bands/sub-carriers). The subscripts tx,1 denote that it is a vector that communication device 100 uses to transmit to communication device 2. Similarly, the subscripts tx,2 denote that it is a vector that communication device 200 uses to transmit to communication device 100.

Under the constraint of an equal gain composite beamforming (EGCBF) process, the power of the transmit signal output by each transmit antenna is the same, and is equal to the total power associated with the transmit signal ($P_{tx}$) divided by the number of transmit antennas. Thus, for communication device 100, that is $P_{tx}/N$. For communication device 200, that is $P_{tx}/M$. Consequently, each power amplifier associated with an antenna need only support 1/N of the total output power. Example: For N=4, $P_{tx}$=17 dBm, each power amplifier need only support a max linear output power of 17−10 log(4)=11 dBm. Thus, whereas for non-equal gain composite beamforming each power amplifier must support to the total transmit power, such is not the case for equal gain beamforming. The equal-gain constraint makes the power amplifier design much simpler. Equal gain CBF performs very close to non-equal gain CBF (within 1–2 dB), but costs significantly less to implement in terms of power amplifier requirements and affords the opportunity to deploy the power amplifiers on the same silicon integrated circuit as the RF circuitry.

When considering a frequency dependent communication channel, the EGCBF constraint implies that for each and every antenna i, the sum of the power $|w_{tx,i}(k)|^2$ of the antenna signal across all of frequencies of the baseband signal (the frequency sub-bands or sub-carrier frequencies k=1 to K) is equal to $P_{tx}/N$. This is the equal gain constraint applied to a frequency dependent channel represented by K sub-carrier frequencies or frequency sub-bands.

An additional constraint can be imposed on the frequency dependent equal gain constraint explained above. This additional constraint is a frequency shaping constraint which requires that at each frequency of the baseband signal to be transmitted (e.g., frequency sub-band or frequency sub-carrier k), the sum of the power of signals across all of the transmit antennas ($|w_{tx,i}(k)|^2$ for i=1 to N) is equal to $P_{tx}/K$. This constraint is useful to ensure that, in an iterative process between two communication devices, the transmit weights of the two devices will converge to optimal values. An additional benefit of this constraint is that the transmitting device can easily satisfy spectral mask requirements of a communication standard, such as IEEE 802.11x.

One solution to a system that combines the frequency selective equal gain constraint and the frequency shaping constraint is that $|w_{tx,i}(k)|^2 = P_{tx}/(KN)$. This solution says that the magnitude of each transmit antenna weight is $P_{tx}/(KN)$. If the transmit weight vector is normalized to unity, i.e., divided by $[P_{tx}/(KN)]^{1/2}$, then the vectors for all of the antennas across all of the k frequency sub-bands becomes a N×K matrix of phase values $e^{j\phi ik}$, where i is the antenna index and k is the sub-band/sub-carrier index.

$$\begin{matrix} e^{j\phi 11} & e^{j\phi 21} & e^{j\phi 31} & \ldots & e^{j\phi N1} \\ e^{j\phi 12} & & & & e^{j\phi N2} \\ e^{j\phi 13} & & & & e^{j\phi N3} \\ \ldots & & & & \ldots \\ e^{j\phi 1K} & e^{j\phi 2K} & e^{j\phi 3K} & \ldots & e^{j\phi NK} \end{matrix}$$

Figure 2:
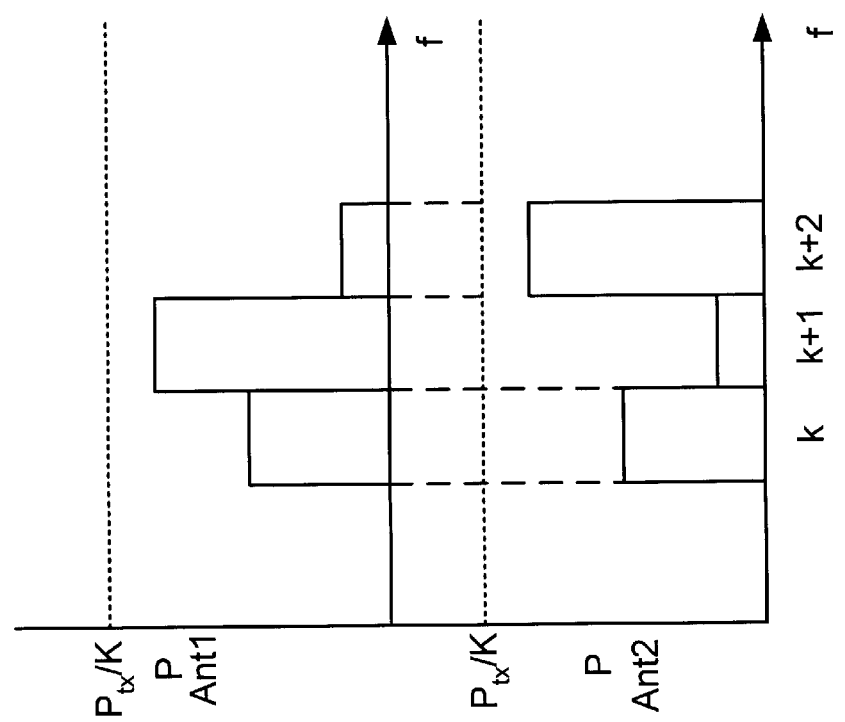
FIG. 2 shows frequency dependent weights for two antennas that are frequency shaped, but not equal gain.

FIG. 2 shows the magnitude of the antenna weights in a 2-antenna example that satisfy the frequency shaping constraint but not the equal gain constraint. The magnitude of the antenna weights for the two antennas at each of three exemplary frequency sub-bands (k, k+1, k+2) are shown. The sum of the magnitude of the antenna weights of both antennas at any of the frequency sub-bands shown adds to a constant value, $P_{tx}/K$.

Figure 3:
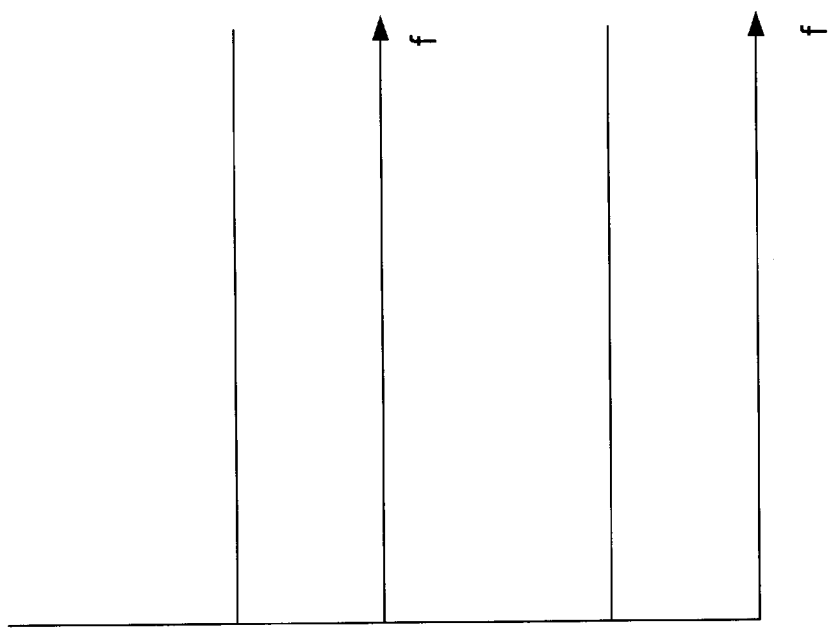
FIG. 3 shows equal gain frequency dependent weights for two antennas.

FIG. 3 shows the magnitude of the antenna weights in the 2-antenna example that satisfy the equal gain constraint and the frequency shaping constraint. In this example, the total power at antenna 1 (i.e., the total area under the weight curve across k frequency sub-bands) is P/2 (N=2 in the example) and the total power of the antennas at any frequency sub-band k is P/K. Thus, the power or magnitude of the transmit antenna weight for any given antenna is equal (constant) across the bandwidth of the baseband signal, and is equal to P/(KN) for all k. In other words, at each antenna, the power is equally distributed across the bandwidth of the baseband signal.

For EGCBF, the optimization problem becomes $$\text{argmax } \{W^H_{tx,1}(k) H^H(k) H(k) w_{tx,1}(k)\}, \text{ subject to } |w_{tx,1}(k)|^2 = P_{tx}/(NK). \quad (1)$$

A closed-form solution to equation (1) is difficult to obtain since it requires the solution of a non-linear system of equations. However, the following necessary conditions for the solution to (1) have been derived and are given below:

Optimal $w_{tx}$ satisfies $w_{tx} = kHw_{tx}$ for some nonzero constant k.

Optimal $w_{tx}$ satisfies $\text{Im}(\Lambda^* H^H H e^{j\Phi}) = 0$, $\Lambda = \text{diag}(e^{j\Phi 0}, e^{j\Phi 1}, \ldots, e^{j\Phi N-1})$, $w_{tx} = e^{j\Phi} = (e^{j\Phi 0}, e^{j\Phi 1}, \ldots, e^{j\Phi N-1})^T$. One solution to equation (1) is an adaptive algorithm for EGCBF. Although the algorithm is not necessarily optimal in terms of solving equation (1), it is simple to implement and simulations have verified that it converges reliably at the expense of only a 1–2 dB performance penalty relative to non-equal gain CBF. This adaptive algorithm is described hereinafter in conjunction with FIG. 5.

Figure 4:
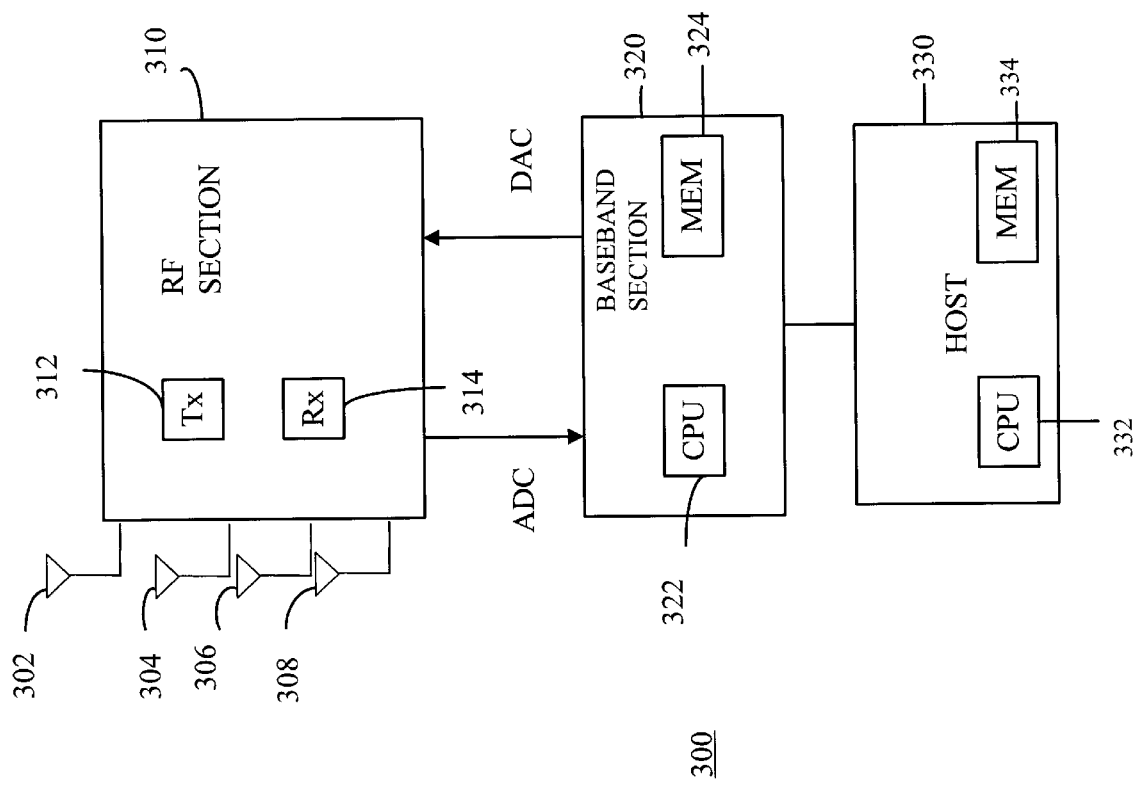
FIG. 4 is a block diagram of a communication device capable of performing equal gain composite beamforming.

The communication devices at both ends of the link, i.e., devices 100 and 200 may have any known suitable architecture to transmit, receive and process signals. An example of a communication device block diagram is shown in FIG. 4. The communication device 300 comprises an RF section 310, a baseband section 420 and optionally a host 330. There are a plurality of antennas, e.g., four antennas 302, 304, 306, 308 coupled to the RF section 310 that are used for transmission and reception. The device may have only two antennas. The RF section 310 has a transmitter (Tx) 312 that upconverts baseband signals for transmission, and a receiver (Rx) 3 14 that downconverts received RF signals for baseband processing. In the context of the composite beamforming techniques described herein, the Tx 312 upconverts and supplies separately weighted signals to corresponding ones of each of the plurality of antennas via separate power amplifiers for simultaneous transmission. Similarly, the Rx 314 downconverts and supplies received signals from each of the plurality of antennas to the baseband section 320. The baseband section 320 performs processing of baseband signals to recover the information from a received signal, and to convert information in preparation for transmission. The baseband section 320 may implement any of a variety of communication formats or standards, such as WLAN standards IEEE 802.11x, Bluetooth™, as well as other standards.

The intelligence to execute the computations for the composite beamforming techniques described herein may be implemented in a variety of ways. For example, a processor 322 in the baseband section 320 may execute instructions encoded on a processor readable memory 324 (RAM, ROM, EEPROM, etc.) that cause the processor 322 to perform the composite beamforming steps described herein. Alternatively, an application specific integrated circuit (ASIC) may be configured with the appropriate firmware, e.g., field programmable gates that implement digital signal processing instructions to perform the composite beamforming steps. This ASIC may be part of, or the entirety of, the baseband section 320. Still another alternative is for the beamforming computations to be performed by a host processor 332 (in the host 330) by executing instructions stored in (or encoded on) a processor readable memory 334. The RF section 310 may be embodied by one integrated circuit, and the baseband section 320 may be embodied by another integrated circuit. The communication device on each end of the communication link need not have the same device architecture or implementation.

Regardless of the specific implementation chosen, the composite beamforming process is generally performed as follows. A transmit weight vector (comprising a plurality of complex transmit antenna weights corresponding to the number of transmit antennas) is applied to, i.e., scaled or multiplied by, a baseband signal to be transmitted, and each resulting weighted signal is coupled to a transmitter where it is upconverted, amplified and coupled to a corresponding one of the transmit antennas for simultaneous transmission. At the communication device on the other end of the link, the transmit signals are, detected at each of the plurality of antennas and downconverted to a baseband signal. Each baseband signal is multiplied by a corresponding one of the complex receive antenna weights and combined to form a resulting receive signal. The architecture of the RF section necessary to accommodate the beamforming techniques described herein may vary with a particular RF design, and many are known in the art and thus is not described herein.

Figure 5:
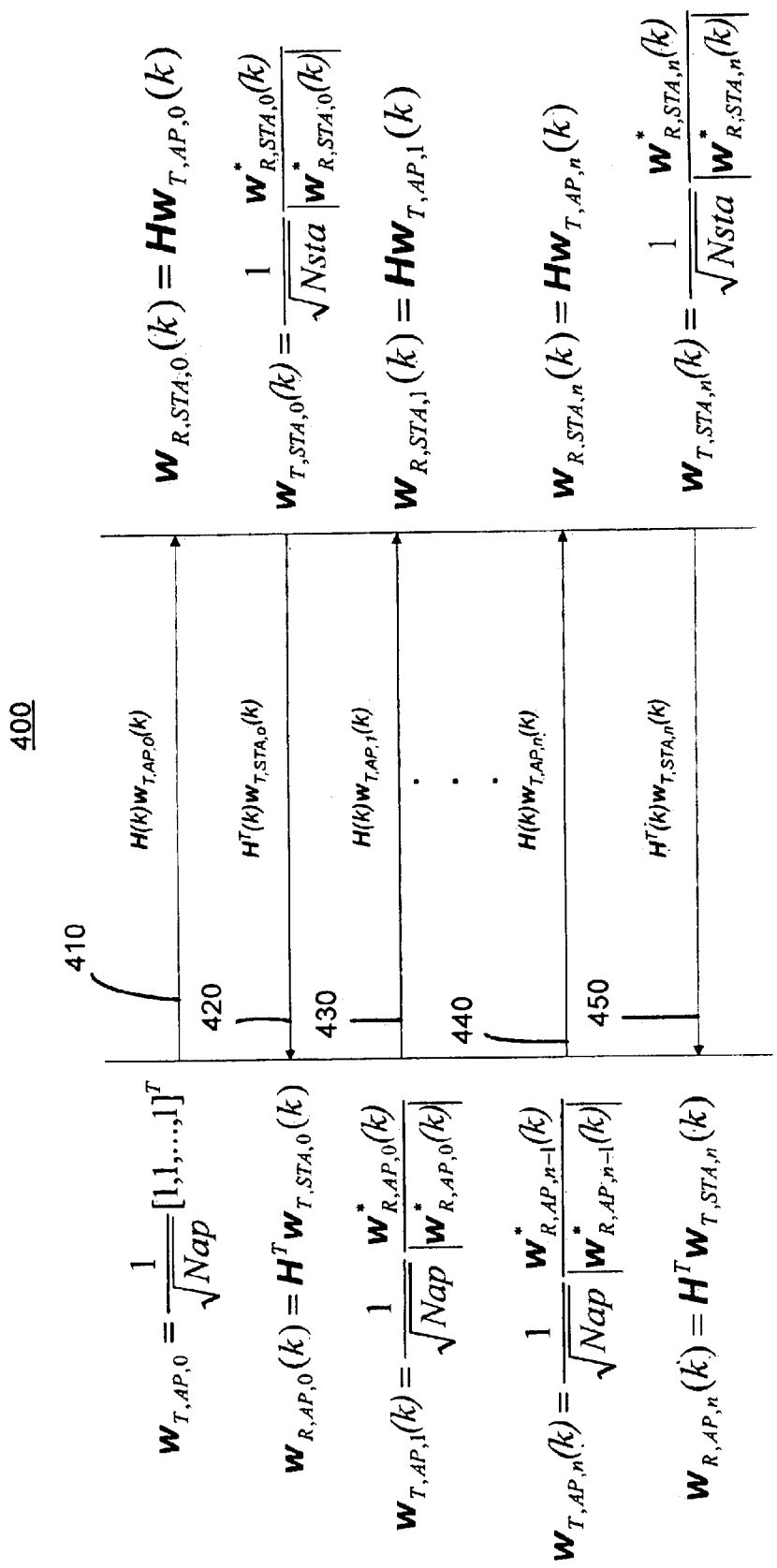
FIG. 5 is a flow diagram showing an adaptive algorithm to obtain equal gain transmit antenna weights for first and second communication devices in communication with each other.

With reference to FIG. 5, an adaptive procedure 400 for determining near optimum transmit antenna weight vectors for first and second communication devices will be described. The antenna weight parameters in FIG. 4 are written with indexes to reflect communication between a WLAN access point (AP) and a station (STA), but without loss of generality, it should be understood that this process is not limited to WLAN application, but is useful in any short-range wireless application. The AP has Nap antennas and the STA has Nsta antennas. Assuming the AP begins with a transmission to the STA, the initial AP transmit weight vector $w_{T,AP,0}(k)$ is [1,1, . . . 1], equal gain and normalized by $1/(Nap)^{1/2}$ for all antennas and all frequency sub-bands/sub-carriers k. Phase for the transmit antenna weights is also initially set to zero. The index T indicates it is a transmit weight vector, index AP indicates it is an AP vector, index 0 is the iteration of the vector, and (k) indicates that it is frequency sub-band/sub-carrier dependent. The index i is the antenna index. The transmit weight vectors identified in FIG. 5 form an N×K matrix explained above.

In step 410, a baseband signal is scaled by the initial AP transmit weight vector $w_{T,AP,0}(k)$, upconverted and transmitted to the STA. The transmitted signal is altered by the frequency dependent channel matrix H(k) from AP-STA. The STA receives the signal and matches its initial receive weight vector $w_{R,STA,0}(k)$ to the signals received at its antennas. In step 420, the STA gain normalizes the receive weight vector $w_{R,STA,0}(k)$ and computes the conjugate of gain-normalized receive weight vector to generate the STA's initial transmit weights for transmitting a signal back to the AP. The STA scales the signal to be transmitted to the AP by the initial transmit weight vector, upconverts that signal and transmits it to the AP. Computing the conjugate for the gain-normalized vector means essentially co-phasing the receive weight vector (i.e., phase conjugating the receive weight vector). The transmitted signal is effectively scaled by the frequency dependent channel matrix $H^T(k)$. At the AP, the receive weight vector is matched to the signals received at its antennas. The AP then computes the conjugate of the gain-normalized receive weight vector as the next transmit weight vector $w_{T,AP,1}(k)$ and in step 430 transmits a signal to the STA with that transmit weight vector. The STA receives the signal transmitted from the AP with this next transmit weight vector and matches to the received signals to compute a next receive weight vector $w_{R,STA,1}(k)$. Again, the STA computes the conjugate of the gain-normalized receive weight vector $w_{R,STA,1}(k)$ as its next transmit weight vector $w_{T,STA,1}(k)$ for transmitting a signal back to the AP. This process repeats for several iterations, ultimately converging to transmit weight vectors that achieve nearly the same performance as non-equal gain composite beamforming. This adaptive process works even if one of the device, such as a STA, has a single antenna for transmission and reception. In addition, throughout the adaptive process, the frequency shaped constraint may be maintained so that for each antenna, the transmit antenna weight is constant across the bandwidth of the baseband signal.

Figure 6:
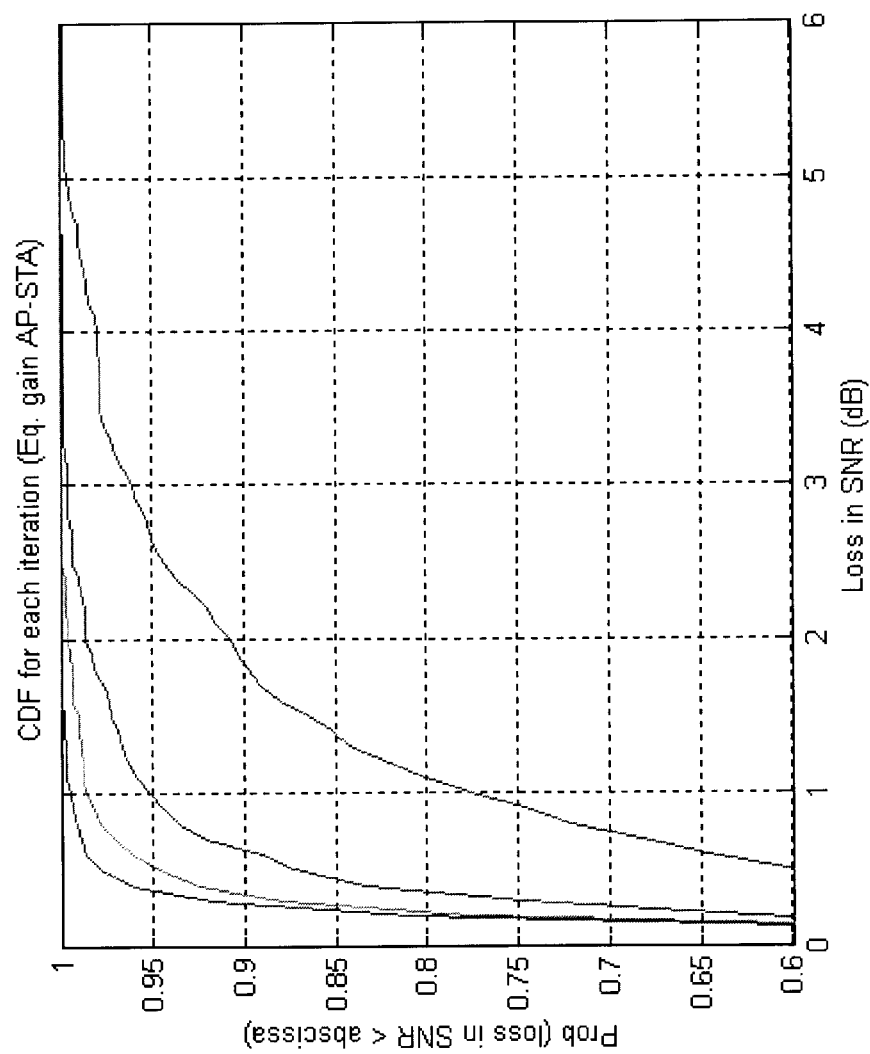
FIG. 6 is a graphical diagram illustrating convergence of the adaptive algorithm shown in FIG.
Figure 7:
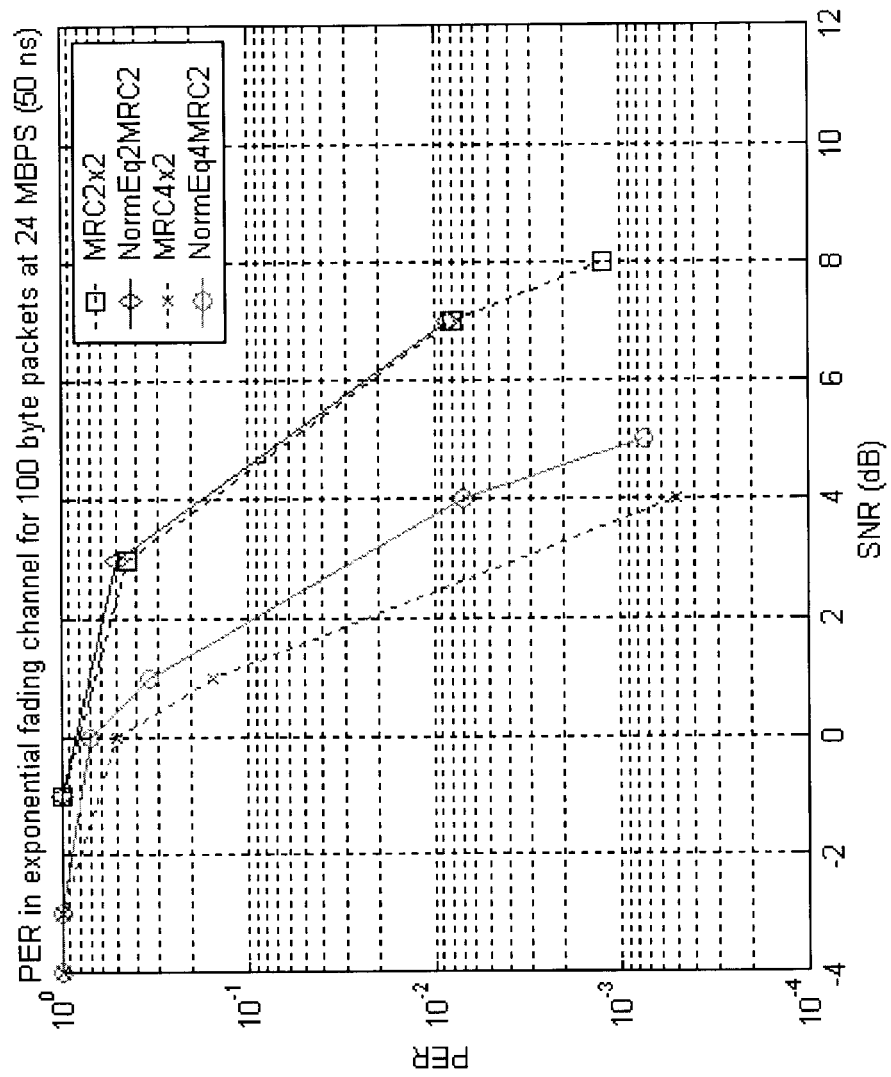
FIG. 7 is a graphical diagram illustrating a performance comparison between equal gain composite beamforming and non-equal gain composite beamforming.

FIG. 6 shows that the adaptive algorithm converges to performance loss that is less than 1 dB with 95% probability after 3–4 iterations. FIG. 7 shows simulation results that indicate that the performance degradation compared to the non-equal gain composite beamforming case is only 1–2 dB.

Each communication device stores the transmit antenna weights determined to most effectively communicate with each of the other communication devices that it may communicate with. The transmit antenna weights may be determined according to the adaptive algorithm described above. When storing the transmit weights of a transmit weight vector, in order to conserve memory space in the communication device, the device may store, for each antenna, weights for a subset or a portion of the total number of weights that span the bandwidth of the baseband signal. For example, if there are K weights for K frequency sub-bands or sub-carrier frequencies, only a sampling of those weights are actually stored, such as weights for every other, every third, every fourth, etc., k sub-band or sub-carrier. Then, the stored subset of transmit weights are retrieved from storage when a device is to commence transmission of a signal, and the remaining weights are generated by interpolation from the stored subset of weights. Any suitable interpolation can be used, such as linear interpolation, to obtain the complete set of weights across the K sub-bands or sub-carriers for each antenna.

Figure 8:
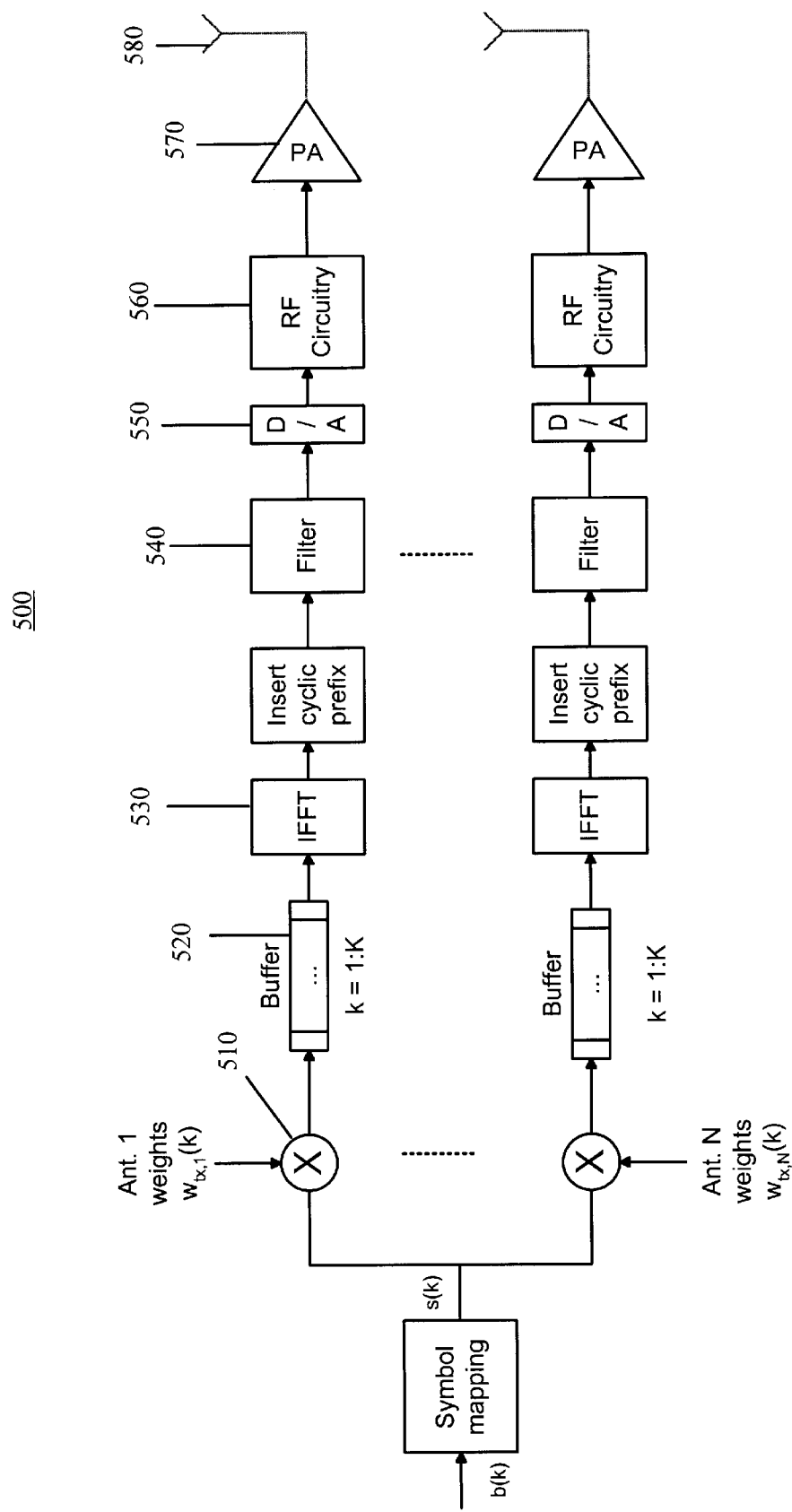
FIG. 8 is a block diagram of a composite beamforming transmission process for a multi-carrier baseband modulation scheme.

With reference to FIG. 8, a beamforming transmission process 500 is shown for a multi-carrier baseband modulation scheme. For an multi-carrier modulation system, such as an orthogonal frequency division multiplexed (OFDM) system used in IEEE 802.11a, the data symbols are in the frequency domain. K symbols are assigned to K sub-carriers (K=52 for 802.11a). For convenience, each of the transmit antenna weights are described as a function of (k), the sub-carrier frequency. The equal gain transmit antenna weights are computed by any of the processes described herein at each of the sub-carrier frequencies. There is a signal processing path for each of the N antennas. In each signal processing path, a multiplier 510 multiplies the frequency domain symbol s(k) by the corresponding equal-gain transmit antenna weight $w_{tx}(k)$ and because $w_{tx}(k)$ has K values, there are K results from the multiplication process. The results are stored in a buffer 520 for k=1 to K. An inverse Fast Fourier Transform (IFFT) 530 is coupled to the buffer to convert the frequency domain results stored in buffer 520 to a digital time domain signal for each of the K sub-carriers. There may be some adjustment made for cyclic prefixes caused by the OFDM process. A filter 540 provides lowpass filtering of the result of the IFFT process. The digital results of the filtering process are converted to analog signals by a D/A 550. The outputs of the D/A 550 are coupled to RF circuitry 560 that upconverts the analog signals to the appropriate RF signal which is coupled via a power amplifier (PA) 570 to one of the N antennas 580. In this manner, for each antenna 580, the signal s(k) is multiplied by respective transmit antenna weights whose phase values may vary as a function of the sub-carrier frequency k.

Figure 9:
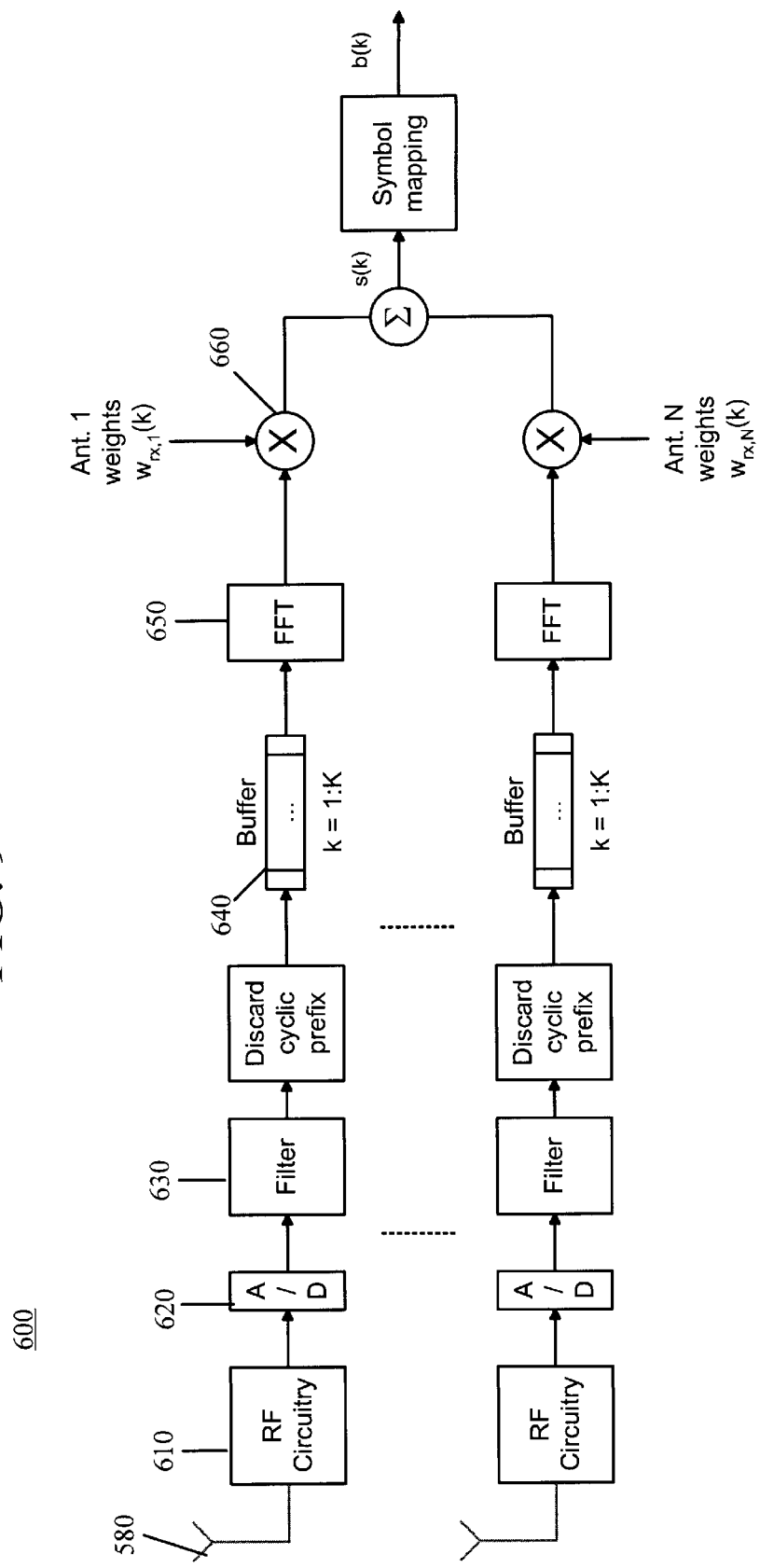
FIG. 9 is a block diagram of a composite beamforming reception process for a multi-carrier baseband modulation scheme.

FIG. 9 shows a reception process 600 that is essentially the inverse of the transmission process 500 shown in FIG. 8. There is a signal processing channel for each of the antennas 580. RF circuitry 610 downconverts the RF signals detected at each antenna 580 for each of the sub-carriers. An A/D 620 converts the analog signal to a digital signal. A lowpass filter 630 filters the digital signal. There may be some adjustment made for cyclic prefixes caused by the OFDM process. A buffer 640 stores the time domain digital signal in slots associated with each sub-carrier frequency k. An FFT 650 converts the time domain digital signal in buffer 640 to a frequency domain signal corresponding to each sub-carrier frequency k. The output of the FFT 650 is coupled to a multiplier 660 that multiplies the digital signal for each sub-carrier k by a corresponding receive antenna weight $w_{rx}(k)$ for the corresponding one of the N antennas. The outputs of each of the multipliers 660 are combined by an adder 670 to recover the digital frequency domain symbol s(k). The signal s(k) is then mapped back to symbol b(k).

Figure 10:
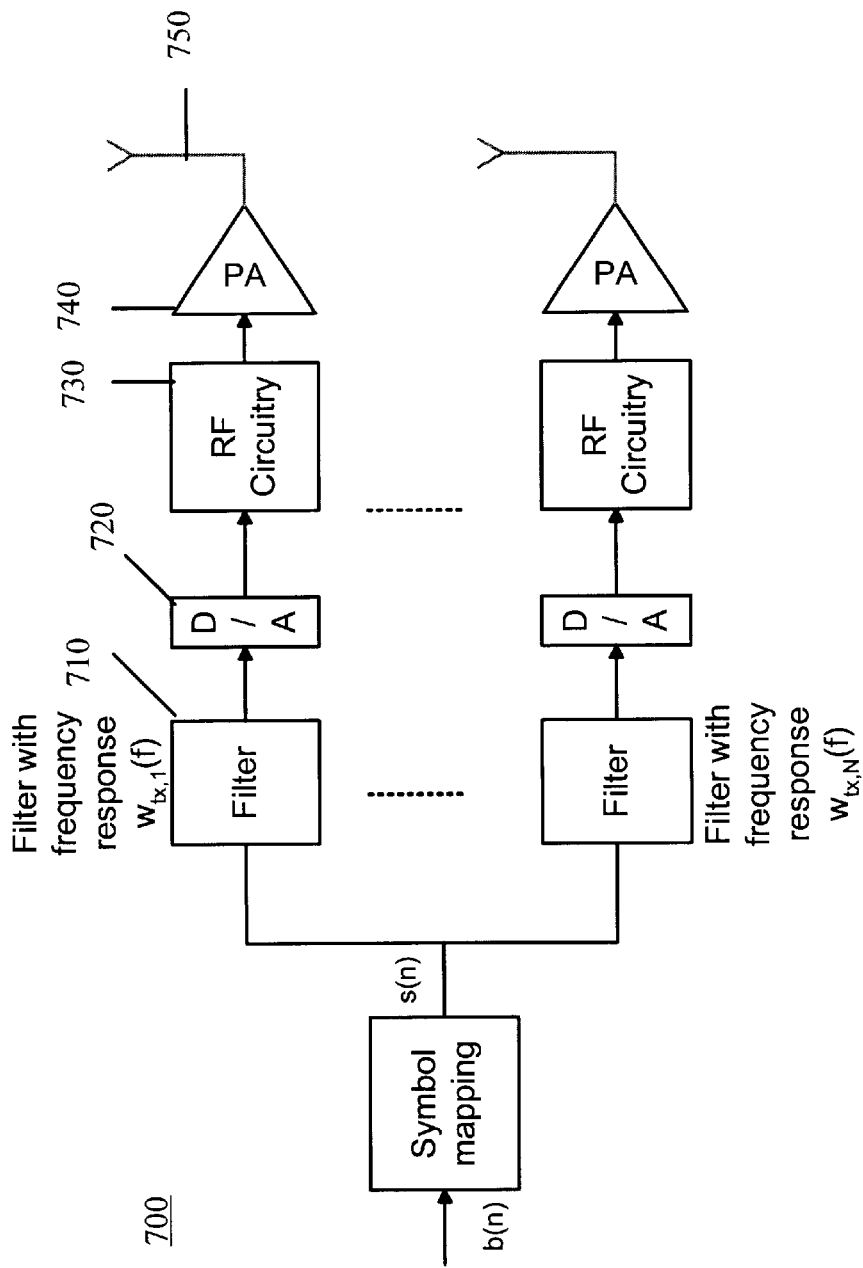
FIG. 10 is a block diagram of a composite beamforming transmission process for a single carrier baseband modulation scheme.
Figure 11:
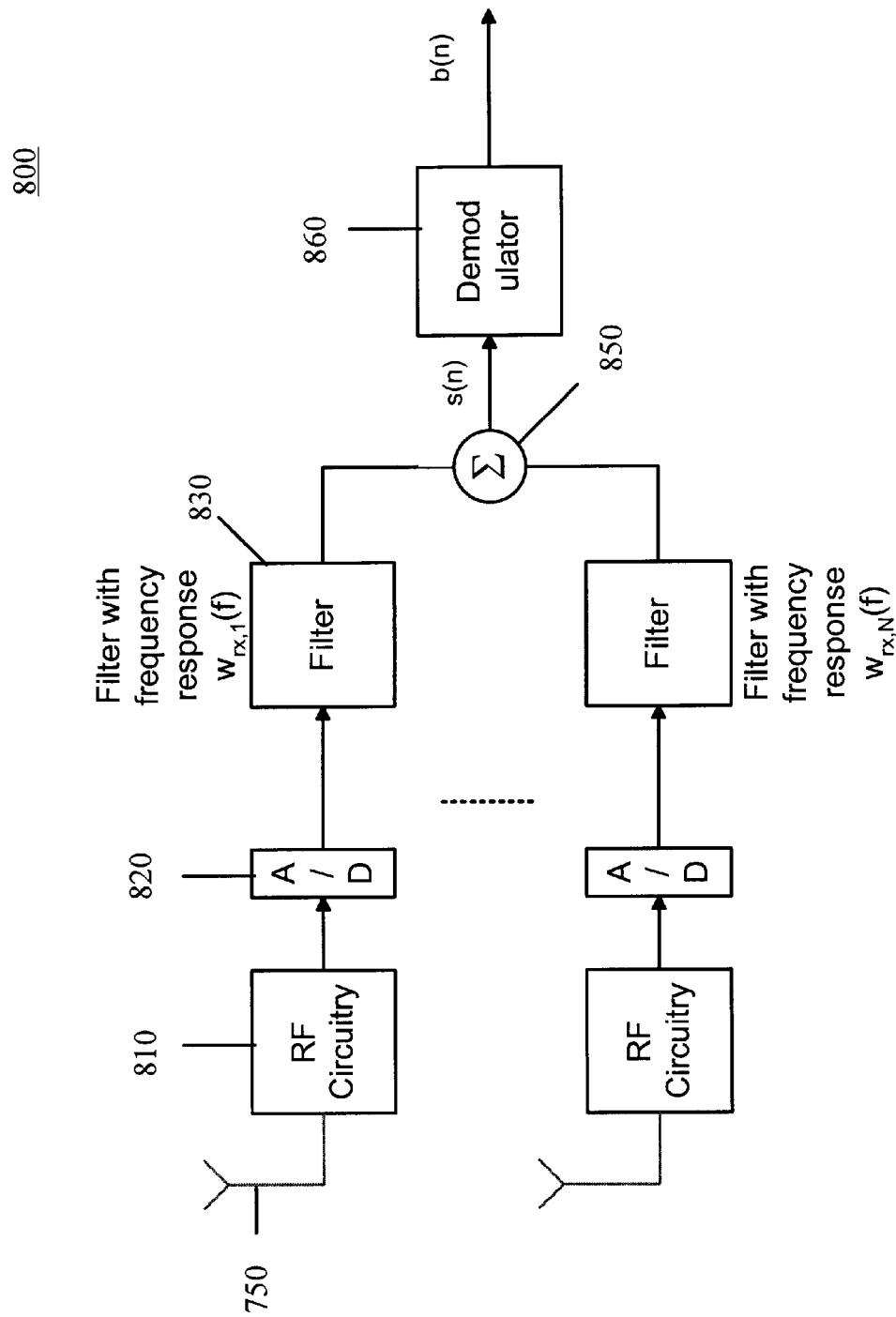
FIG. 11 is a block diagram of a composite beamforming reception process for a single carrier baseband modulation scheme.

FIGS. 10 and 11 show transmission and reception processes, respectively, for applicable to a single-carrier baseband modulation scheme, such as that used by the IEEE 802.11b standard. The data symbols in such a system are in the time domain. FIG. 10 shows a beamforming transmission process 700. Since in a frequency dependent channel, the transmit antenna weights are frequency dependent, the passband of the time-domain baseband signal is synthesized into frequency bins or sub-bands (K bins or sub-bands) and equal gain transmit beamforming weights are computed for each frequency bin using any of the processes described herein. There are processing channels for each antenna. In each processing channel, transmit filters 710 are synthesized with the frequency response specified by the beamforming weights. Thus, each transmit filter 710 has a frequency response defined by the transmit antenna weight $w_{tx}(f)$ associated with that antenna. The data symbol s(n) is passed through the transmit filter 710 which in effect applies the frequency dependent antenna weight $w_{tx}(f)$ to the data symbol s(n). The D/A 720 converts the digital output of the transmit filter 710 to an analog signal. The RF circuitry 730 upconverts the analog signal and couples the upconverted analog signal to an antenna 750 via a power amplifier 740.

FIG. 11 shows a reception process 800 suitable for a single carrier system. There is a processing channel for each antenna 750. In each processing channel, RF circuitry 810 downconverts the received RF signal. An A/D 820 converts the downconverted analog signal to a digital signal. Like the frequency dependent transmit antenna weights, the receive antenna weights are computed for the plurality of frequency sub-bands. Receive filters 830 are synthesized with the frequency response specified by the frequency dependent receive beamforming weights $w_r(f)$ and the received digital signal is passed through filters 830 for each antenna, effectively applying a frequency dependent antenna weight to the received signal for each antenna. The results of the filters 830 are combined in an adder 850, and then passed to a demodulator 860 for demodulation.

FIG. 12 shows a procedure for use when only one of the two devices supports beamforming. For example, N-CBF is supported at a first communication device (an AP) but not at a second communication device (a STA). In this case, the STA is likely to support 2-antenna Tx/Rx selection diversity as discussed previously. If this is the case, it is possible for the AP to achieve 3 dB better performance than Nth order maximal ratio combining (MRC) at both ends of the link.

When a STA associates or whenever a significant change in channel response is detected, the AP sends a special training sequence to help the STA select the best of its two antennas. The training sequence uses messages entirely supported by the applicable media access control protocol, which in the following example is IEEE 802.11x.

The sequence consists of 2 MSDUs (ideally containing data that is actually meant for the STA so as not to incur a loss in throughput). In step 900, the AP sends the first MSDU using a Tx weight vector having equal gain orthogonal transmit weights (also optionally frequency shaped). For example, if the number of AP antennas is 4, the transmit weight vector is $[1\ 1\ 1\ 1]^T$. In step 910, the 2-antenna selection diversity STA responds by transmitting a message using one of its two antennas; the antenna that best received the signal from the AP. The AP decodes the message from the STA, and obtains one row of the H matrix (such as the first row $h_{r1}$). In step 920, the AP sends the second MSDU using a frequency dependent transmit weight vector which is orthogonal to the first row of H (determined in step 610), and equal-gain normalized such that the magnitude of the signals at each antenna is equal to P/N. In addition, the transmit weight vector may be frequency shaped across so that at each frequency of the baseband signal, the sum of the power output by the antennas of the first communication device is constant across. When the STA receives the second MSDU, it forces the STA to transmit a response message in step 630 using the other antenna, allowing the AP to see the second row of the H matrix, such as $h_{r2}$. Now the AP knows the entire H matrix. The AP then decides which row of the H matrix will provide "better" MRC at the STA by computing a norm of each row, $h_{r1}$ and $h_{r2}$, of the H matrix and, and selecting the row that has the greater norm as the frequency dependent transmit weight vector for further transmissions to that STA until another change is detected in the channel. The row that is selected is equal gain normalized before it is used for transmitting to that STA.

Equal gain composite beamforming provides significant advantages. By reducing output power requirements for each power amplifier, the silicon area of the power amplifiers are reduced by as much as N times (where N is equal to the number of antennas) relative to non-equal gain CBF. The silicon area savings translates into a cost savings due to (1) less silicon area, and (2) the ability to integrate the power amplifiers onto the same die (perhaps even the same die as the radio frequency transceiver itself).

The efficiency (efficiency being defined as the output power divided by DC current consumption) for each power amplifier is N times larger in the EGCBF case than in the non-equal gain CBF case. With EGCBF, the same output power as non-equal CBF is achieved with N times less DC current.

Equal gain CBF reduces power requirements for each of the power amplifiers, which in turn increases the output impedance of each of the power amplifiers (since impedance is inversely proportional to current, and supply current requirements will be reduced). When the output impedance of the power amplifier is increased, the matching networks required for the power amplifiers are greatly simplified and require less silicon area. Moreover, reducing power requirements for the individual power amplifiers provides greater flexibility for systems with low supply voltage.

To summarize, a method is provided that accomplishes applying a transmit weight vector to a baseband signal to be transmitted from the first communication device to the second communication device, the transmit weight vector comprising a complex transmit antenna weight for each of N plurality of antennas of the first communication device, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weight associated with each antenna is such that the power to be output at each antenna is the same and is equal to the total power to be output by all of the N antennas divided by N; receiving at the N plurality of antennas of the first communication device a signal that was transmitted by the second communication device; determining a receive weight vector comprising a plurality of complex receive antenna weights for the N plurality of antennas of the first communication device from the signals received by the N plurality of antennas, wherein each receive antenna weight has a magnitude and a phase whose values may vary with frequency; and updating the transmit weight vector for the N plurality of antennas of the first communication device for transmitting signals to the second communication device by gain normalizing the receive weight vector and computing a conjugate thereof. This process may be performed such that at substantially all frequencies of the baseband signal, the sum of the magnitude of the complex transmit antenna weights across the plurality of antennas of the first communication device is constant. Moreover, where the bandwidth of the baseband signal comprises K plurality of frequency sub-bands, the magnitude of the complex transmit antenna weights associated with each of the N plurality of antennas is such that the power to be output by each antenna is the same and is equal to 1/(KN) of the total power to be output for all of the K frequency sub-bands. This process may be embodied by instructions encoded on a medium or in a communication device.

In addition, a method is provided that accomplishes a method for communicating signals from a first communication device to a second communication device using radio frequency (RF) communication techniques, comprising: applying to a first signal to be transmitted from the first communication device to the second communication device a transmit weight vector, the transmit weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N; from a first response signal at the plurality of antennas of the first communication device transmitted from a first of two antennas of the second communication device, deriving a first row of a channel response matrix that describes the channel response between the first communication device and the second communication device; applying to a second signal for transmission by the plurality of antennas of the first communication device a transmit weight vector that is orthogonal to the first row of the channel response matrix, and wherein the transmit weight vector comprises a plurality of complex transmit antenna weights, wherein each complex transmit antenna weight has a magnitude and a phase whose values may vary with frequency across a bandwidth of the second signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N; deriving a second row of the channel response matrix from a second response signal received from a second of the two antennas of the second communication device; and selecting one of the first and second rows of the channel response matrix that provides better signal-to-noise at the second communication device as the transmit weight vector for further transmission of signals to the second communication device. This process may be performed such that at substantially all frequencies of the baseband signal, the sum of the magnitude of the complex transmit antenna weights across the plurality of antennas of the first communication device is constant. Moreover, where the bandwidth of the baseband signal comprises K plurality of frequency sub-bands, the magnitude of the complex transmit antenna weights associated with each of the N plurality of antennas is such that the power to be output by each antenna is the same and is equal to 1/(KN) of the total power to be output for all of the K frequency sub-bands. This process may be embodied by instructions encoded on a medium or in a communication device.

The above description is intended by way of example only.

What is claimed is:

1. A method for communicating between a first communication device having N plurality of antennas and a second communication device using radio frequency (RF) communication techniques, comprising:

a. applying a transmit weight vector to a baseband signal to be transmitted from the first communication device to the second communication device, the transmit weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N and such that the sum of the power at each corresponding frequency across the N transmit signals is equal to a constant; and b. transmitting the N transmit signals from corresponding ones of the plurality of antennas to the second communication device.

2. The method of claim 1, wherein the bandwidth of the baseband signal comprises K plurality of frequency sub-bands, and the magnitude of the complex transmit antenna weights associated with each antenna is such that the power to be output by each antenna is the same and is equal to 1/(KN) of the total power to be output for all of the K frequency sub-bands.

3. The method of claim 1, wherein step (a) is performed for each of K frequency sub-bands of the baseband signal that correspond to sub-carriers of a multi-carrier baseband signal or synthesized frequency sub-bands of a single carrier baseband signal.

4. The method of claim 3, and further comprising storing in the first communication device, for each of the N antennas,.complex transmit antenna weights for a subset of the K frequency sub-bands or sub-carriers.

5. The method of claim 4, and further comprising retrieving the stored subset of complex transmit antenna weights and generating therefrom the complete set of antenna weights for all of the K frequency sub-bands or sub-carriers using interpolation techniques.

6. A method for communicating between a first communication device and a second communication device using radio frequency (RF) communication techniques, comprising:

a. applying a transmit weight vector to a baseband signal to be transmitted from the first communication device to the second communication device, the transmit weight vector comprising a complex transmit antenna weight for each of N plurality of antennas as of the first communication device, wherein each complex transmit antenna weight has a magnitude and a phase whose values may vary with frequency across a bandwidth of the baseband signal, thereby generating N transmit signals each of which is weighted across the bandwidth of the baseband signal to be transmitted from corresponding ones of the N plurality of antennas to the second communication device, wherein the magnitude of the complex transmit antenna weight associated with each antenna is such that the power to be output at each antenna is the same and is equal to the total power to be output by all of the N antennas divided by N and such that the sum of the power at each corresponding frequency across the N transmit signals is equal to a constant; and;

b. receiving the N transmit signals at one or more antennas of the second communication device;

c. determining a receive weight vector comprising a plurality of complex receive antenna weights for the one or more antennas of the second communication device from the signals received by the one or more antennas, wherein each receive antenna weight has a magnitude and a phase whose values may vary with frequency;

d. computing a transmit weight vector comprising one or more complex transmit antenna weights for the one or more antennas of the second communication device by gain normalizing the receive weight vector and computing a conjugate thereof; and c. applying to a baseband signal to be transmitted from the second communication device to the first communication device the transmit weight vector associated with the one or more antennas of the second communication device, wherein the transmit weight vector comprises one or more complex transmit antenna weight having a magnitude and a phase whose values may vary with frequency across the bandwidth of the baseband signal to be transmitted, thereby generating one or more transmit signals each of which is weighted across the bandwidth of the baseband signal to be transmitted from a corresponding one or ones of the one or more antennas of the second communication device to the first communication device.

7. The method of claim 6, wherein the second communication device comprises M plurality of antennas, and wherein the step (d) of computing a transmit weight vector comprises gain normalizing the receive weight vector, and computing a conjugate thereof, to generate a plurality of complex transmit antenna weights having a magnitude and phase whose values may vary with frequency, and wherein step (c) of applying comprises applying the transmit weight vector to the baseband signal to generate M plurality of transmit signals for transmission by corresponding ones of the M plurality of antennas, and wherein the magnitude of the complex transmit antenna weight associated with each antenna is such that the power to be output at each antenna is the same and is equal to the total power to be output by all of the M antennas divided by M and such that the sum of the power at each corresponding frequency across the M transmit signals is equal to a constant.

8. The method of claim 6, and further comprising the steps of:

f. receiving one or more transmit signals from the second communication device at the N plurality of antennas of the first communication device;

g. determining a receive weight vector comprising a plurality of complex receive antenna weights for the N plurality of antennas of the first communication device from the one or more signals received at the N plurality of antennas, wherein each receive antenna weight has a magnitude and a phase whose values may vary with frequency across the bandwidth of the baseband signal; and h. updating the transmit weight vector for the N plurality of antennas of the first communication device by gain normalizing the receive weight vector and computing a conjugate thereof.

9. The method of claim 8, and further comprising repeating steps (a) through (h) for signals transmitted between the first and second communication devices.

10. The method of claim 6, wherein the bandwidth of the baseband signal to be transmitted from the first communication device to the second communication device comprises K plurality of frequency sub-bands, and further comprising the step of computing the plurality of complex transmit antenna weights at the first communication device such that the power to be output by each antenna is the same and is equal to 1/(KN) of the total power to be output for all of the K frequency sub-bands.

11. The method of claim 6, wherein steps (a) through (e) are performed for each of K frequency sub-bands of the baseband signal that correspond to sub-carriers of a multi-carrier baseband signal or synthesized frequency sub-bands of a single carrier baseband signal.

12. The method of claim 11, and further comprising storing in the first communication device, for each of the N antennas, complex transmit antenna weights for a subset of the K frequency sub-bands or sub-carriers.

13. The method of claim 12, and further comprising retrieving the stored subset of complex transmit antenna weights and generating therefrom the complete set of antenna weights for all of the K frequency sub-bands or sub-carriers using interpolation techniques.

14. A method for communicating between a first communication device and a second communication device using radio frequency (RF) communication techniques, comprising:

a. applying a transmit weight vector to a baseband signal to be transmitted from the first communication device to the second communication device, the transmit weight vector comprising a complex transmit antenna weight for each of N plurality of antennas of the first communication device, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weight associated with each antenna is such that the power to be output at each antenna is the same and is equal to the total power to be output by all of the N antennas divided by N and such that the sum of the power at each corresponding frequency across the N transmit signals is equal to a constant;

b. receiving at the N plurality of antennas of the first communication device one or more signals transmitted by the second communication device;

c. determining a receive weight vector comprising a plurality of complex receive antenna weights for the N plurality of antennas of the first communication device from the one or more signals received by the N plurality of antennas, wherein each receive antenna weight has a magnitude and a phase whose values may vary with frequency; and d. updating the transmit weight vector for the N plurality of antennas of the first communication device for transmitting signals to the second communication device by gain normalizing the receive weight vector and computing a conjugate thereof.

15. The method of claim 14, wherein the step of determining a receive weight vector comprises matching the receive antenna weights to the receive signal at the N plurality of antennas.

16. The method of claim 14, and further comprising repeating steps (a) through (d) for signals transmitted between the first and second communication devices.

17. The method of claim 14, wherein the bandwidth of the baseband signal comprises K plurality of frequency sub-bands, and the magnitude of the complex transmit antenna weights associated with each of the N plurality of antennas is such that the power to be output by each antenna is the same and is equal to 1/(KN) of the total power to be output for all of the K frequency sub-bands.

18. The method of claim 14, wherein steps (a) through (d) are performed for each of K frequency sub-bands of the baseband signal that correspond to sub-carriers of a multi-carrier baseband signal or synthesized frequency sub-bands of a single carrier baseband signal.

19. The method of claim 18, and further comprising storing in the first communication device, for each of the N antennas, complex transmit antenna weights for a subset of the K frequency sub-bands or sub-carriers.

20. The method of claim 19, and further comprising retrieving the stored subset of complex transmit antenna weights and generating therefrom the complete set of antenna weights for all of the K frequency sub-bands or sub-carriers using interpolation techniques.

21. A medium encoded with instructions that, when executed, perform a method comprising the step of applying a transmit weight vector to a baseband signal to be transmitted from a first communication device to a second communication device, the transmit weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N and such that the sum of the power at each corresponding frequency across the N transmit signals is equal to a constant.

22. The medium of claim 21, and further comprising instructions that apply the transmit antenna weights for each of K frequency sub-bands of the baseband signal that correspond to sub-carriers of a multi-carrier baseband signal or synthesized frequency sub-bands of a single carrier baseband signal.

23. The medium of claim 22, and further comprising instructions for storing in the first communication device, for each of the N antennas, complex transmit antenna weights for a subset of the K frequency sub-bands or sub-carriers.

24. The medium of claim 23, and further comprising instructions for retrieving the stored subset of complex transmit antenna weights and generating therefrom the complete set of antenna weights for all of the K frequency sub-bands or sub-carriers using interpolation techniques.

25. The medium of claim 22, and further comprising instructions encoded on the medium for applying the transmit weight vector such that the power to be output by each antenna is the same and is equal to 1/(KN) of the total power to be output for all of the K frequency sub-bands.

26. The medium of claim 21, wherein the instructions are implemented by a plurality of gates.

27. The medium of claim 21, wherein the instructions are processor readable instructions, that when executed by a processor, cause the processor to perform the applying step.

28. A medium encoded with instructions that, when executed, perform a method comprising the steps of:
   a. applying a transmit weight vector to a baseband signal to be transmitted from a first communication device to a second communication device, the transmit weight vector comprising a complex transmit antenna weight for each of N plurality of antennas of the first communication device, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weight associated with each antenna is such that the power to be output at each antenna is the same and is equal to the total power to be output by all of the N antennas divided by N and such that the sum of the power at each corresponding frequency across the N transmit signals is equal to a constant;
   b. from a signal transmitted by a second communication device and received at the plurality of antennas of the first communication device, determining a receive weight vector comprising a plurality of complex receive antenna weights for the N plurality of antennas of the first communication device from the signals received by the N plurality of antennas, wherein each receive antenna weight has a magnitude and a phase whose values may vary with frequency; and
   c. updating the transmit weight vector for the N plurality of antennas of the first communication device for transmitting signals to the second communication device by gain normalizing the receive weight vector and computing a conjugate thereof.

29. The medium of claim 28, and further comprising instructions that apply the transmit antenna weights for each of K frequency sub-bands of the baseband signal that correspond to sub-carriers of a multi-carrier baseband signal or synthesized frequency sub-bands of a single carrier baseband signal.

30. The medium of claim 29, and further comprising instructions for storing in the first communication device, for each of the N antennas, complex transmit antenna weights for a subset of the K frequency sub-bands or sub-carriers.

31. The medium of claim 30, and further comprising instructions for retrieving the stored subset of complex transmit antenna weights and generating therefrom the complete set of antenna weights for all of the K frequency sub-bands or sub-carriers using interpolation techniques.

32. The medium of claim 29, and further comprising instructions for applying the transmit weight vector such that the power to be output by each antenna is the same and is equal to 1/(KN) of the total power to be output for all of the K frequency sub-bands.

33. The medium of claim 28, wherein the instructions are implemented by a plurality of gates.

34. The medium of claim 28, wherein the instructions are processor readable instructions, that when executed by a processor, cause the processor to perform steps (a) through (c).

35. An integrated circuit comprising the medium of claim 33.

36. A system comprising the medium of claim 34, and further comprising a processor that executes the instructions encoded on the medium.

37. A communication device comprising the integrated circuit of claim 35, and further comprising:
   a. a transmitter to be coupled to N plurality of antennas to upconvert transmit signals for transmission via respective ones of the plurality of antennas; and
   b. a receiver to be coupled to the N plurality of antennas to downconvert signals received by the plurality of antennas.

38. A method for communicating between a first communication device and a second communication device using radio frequency (RF) communication techniques, comprising:
   a. applying to a first signal to be transmitted from the first communication device to the second communication device a transmit weight vector, the transmit weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N;
   b. transmitting the first signal to the second communication device;
   c. receiving a first response signal at the plurality of antennas of the first communication device transmitted from a first of two antennas of the second communication device;
   d. deriving a first row of a channel response matrix that describes the channel response between the first communication device and the second communication device;
   e. transmitting a second signal by the plurality of antennas of the first communication device using a transmit weight vector that is orthogonal to the first row of the channel response matrix, and wherein the transmit weight vector comprises a plurality of complex transmit antenna weights, wherein each complex transmit antenna weight has a magnitude and a phase whose values may vary with frequency across a bandwidth of the second signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N;
   f. receiving a second response signal transmitted by a second of the two antennas of the second communication device and deriving therefrom a second row of the channel response matrix; and
   g. selecting one of the first and second rows of the channel response matrix that provides better signal-to-noise at the second communication device as the transmit weight vector for further transmission of signals to the second communication device.

39. The method of claim 38, and further comprising the step of computing a norm of each row of the channel response matrix, and wherein the step of selecting comprises selecting the row that has the greater norm.

40. The method of claim 38, wherein at substantially all frequencies of the baseband signal, the sum of the magnitude of the complex transmit antenna weights across the plurality of antennas of the first communication device is constant.

41. The method of claim 40, wherein the bandwidth of the baseband signal comprises K plurality of frequency sub-bands, and the magnitude of the complex transmit antenna weights associated with each antenna is such that the power to be output by each antenna is the same and is equal to 1/(KN) of the total power to be output for all of the K frequency sub-bands.

42. The method of claim 41, wherein steps (a), (d) and (g) are performed for each of K frequency sub-bands of the baseband signal that correspond to sub-carriers of a multi-carrier baseband signal or synthesized frequency sub-bands of a single carrier baseband signal.

43. The method of claim 42, and further comprising storing in the first communication device, for each of the N antennas, complex transmit antenna weights for a subset of the K frequency sub-bands or sub-carriers.

44. The method of claim 43, and further comprising retrieving the stored subset of complex transmit antenna weights and generating therefrom the complete set of antenna weights for all of the K frequency sub-bands or sub-carriers using interpolation techniques.

45. A medium encoded with instructions, that when, executed perform the method comprising steps of:
   i. applying to a first signal to be transmitted from the first communication device to the second communication device a transmit weight vector, the transmit weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N;
   ii. from a first response signal at the plurality of antennas of the first communication device transmitted from a first of two antennas of the second communication device, deriving a first row of a channel response matrix that describes the channel response between the first communication device and the second communication device;
   iii. applying to a second signal for transmission by the plurality of antennas of the first communication device a transmit weight vector that is orthogonal to the first row of the channel response matrix, and wherein the transmit weight vector comprises a plurality of complex transmit antenna weights, wherein each complex transmit antenna weight has a magnitude and a phase whose values may vary with frequency across a bandwidth of the second signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N;
   iv. deriving a second row of the channel response matrix from a second response signal received from a second of the two antennas of the second communication device; and
   v. selecting one of the first and second rows of the channel response matrix that provides better signal-to-noise at the second communication device as the transmit weight vector for further transmission of signals to the second communication device.

46. The medium of claim 45, and further comprising instructions that compute a norm of each row of the channel response matrix, and selects the row that has the grater norm as the transmit weight vector.

47. The medium of claim 45, and further comprising instructions that apply the transmit antenna weights for each of K frequency sub-bands of the baseband signal that correspond to sub-carriers of a multi-carrier baseband signal or synthesized frequency sub-bands of a single carrier baseband signal.

48. The medium of claim 45, and further comprising instructions that store, for each of the N antennas, complex transmit antenna weights for a subset of the K frequency sub-bands or sub-carriers.

49. The medium of claim 48, and further comprising instructions that retrieve the stored subset of complex transmit antenna weights and generate therefrom the complete set of antenna weights for all of the K frequency sub-bands or sub-carriers using interpolation techniques.

50. The medium of claim 45, and further comprising instructions that set the magnitude of the complex transmit antenna weights such that at substantially all frequencies of the baseband signal, the sum of the power across the plurality of antennas is constant.

51. A communication device comprising the medium of claim 45, and further comprising:
   a. a transmitter that upconverts signals to be transmitted via N plurality of antennas;
   b. a receiver that downconverts signals received by the N plurality of antennas; and
   c. a processor coupled to the transmitter and to the receiver that processes the instructions encoded on the medium.

52. The method of claim 7, and further comprising the steps of:
   f. receiving the M transmit signals from the second communication device at the N plurality of antennas of the first communication device;
   g. determining a receive weight vector comprising a plurality of complex receive antenna weights for the N plurality of antennas of the first communication device from the signals received at the N plurality of antennas, wherein each receive antenna weight has a magnitude and a phase whose values may vary with frequency across the bandwidth of the baseband signal; and
   h. updating the transmit weight vector for the N plurality of antennas of the first communication device by gain normalizing the receive weight vector and computing a conjugate thereof.

53. The method of claim 52, and further comprising repeating steps (a) through (h) for signals transmitted between the first and second communication devices.

54. The method of claim 52, wherein the bandwidth of the baseband signal to be transmitted from the second communication device to the first communication device comprises K plurality of frequency sub-bands, and further comprising the step of computing the plurality of complex transmit antenna weights at the second communication device such that the power to be output by each of the M plurality of antennas is the same and is equal to 1/(KM) of the total power to be output for all of the K frequency sub-bands.

55. A radio communication system comprising:
a. a first communication device having N plurality of antennas, a baseband signal processor that generates N transmit signals and that recovers data from N receive signals and a radio transceiver coupled to the baseband signal processor that upconverts the N transmit signals for transmission via corresponding ones of the N plurality of antennas and downconverts signals received by corresponding ones of the N plurality of antennas to produce the N receive signals, wherein the baseband signal processor of the first communication device applies a transmit weight vector to a baseband signal to be transmitted from the first communication device to the second communication device, the transmit weight vector comprising a complex transmit antenna weight for each of N plurality of antennas of the first communication device, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weight associated with each antenna is such that the power to be output at each antenna is the same and is equal to the total power to be output by all of the N antennas divided by N and such that the sum of the power at each corresponding frequency across the N transmit signals is equal to a constant; and
b. a second communication device having M plurality of antennas, a baseband signal processor that generates M transmit signals and that recovers data from M receive signals and a radio transceiver coupled to the baseband signal processor that upconverts the M transmit signals for transmission via corresponding ones of the M plurality of antennas and downconverts signals received by corresponding ones of the M plurality of antennas to produce the M receive signals, wherein the baseband signal processor of the second communication device: determines a receive weight vector comprising complex receive weights for each of the M plurality of antennas from the N transmit signals received by the M plurality of antennas, wherein each receive antenna weight has a magnitude and phase whose values may vary with frequency across a bandwidth of a baseband signal derived from the N transmit signals received by the second communication device; computes a transmit weight vector comprising a plurality of complex transmit antenna weights for the M plurality of antennas of the second communication device by computing a conjugate of the receive weight vector divided by the norm of the receive weight vector; and applies the transmit weight vector to a baseband signal to be transmitted from the second communication device to the first communication device, thereby generating M plurality of transmit signals such that the power to be output at each antenna is the same and is equal to the total power to be output by all of the M antennas divided by M and such that the sum of the power at each corresponding frequency across the M transmit signals is equal to a constant.

56. The system of claim 55, wherein the baseband signal processor of the first communication device further determines a receive weight vector from the M transmit signals received from the second communication device by the N plurality of antennas, and updates the transmit weight vector for the N plurality of antennas of the first communication device for transmitting signals to the second communication device by computing a conjugate of the receive weight vector of the first communication device divided by a norm of the conjugate of the receive weight vector, and wherein the baseband signal processor of the first communication device and baseband signal processor of the second communication device update their respective transmit weight vectors for signals received from the other communication device.

57. A radio communication device comprising:
a. N plurality of antennas;
b. a baseband signal processor that generates transmit signals and that recovers data from receive signals; and
c. a radio transceiver coupled to the baseband signal processor that upconverts the transmit signals for transmission via corresponding ones of the N plurality of antennas and downconverts signals received by corresponding ones of the N plurality of antennas to produce receive signals;
d. wherein the baseband signal processor applies a transmit weight vector to a baseband signal to be transmitted to another communication device, the transmit weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N and such that the sum of the power at each corresponding frequency across the N transmit signals is equal to a constant.

58. The radio communication device of claim 57, wherein the bandwidth of the baseband signal comprises K plurality of frequency sub-bands, and the baseband signal processor sets the magnitude of the complex transmit antenna weights associated with each antenna such that the power to be output by each antenna is the same and is equal to 1/(KN) of the total power to be output for all of the K frequency sub-bands.

59. The radio communication device of claim 57, wherein the baseband signal processor determines a receive weight vector based on one or more signals received at the N plurality of antennas from the other communication device, the receive weight vector comprising a plurality of complex receive antenna weights for the N plurality of antennas, and updates the transmit weight vector for the N plurality of antennas for transmitting signals to the second communication device by gain normalizing the receive weight vector and computing a conjugate thereof.

60. The radio communication device of claim 57, wherein the baseband signal processor updates the transmit weight vector each time a transmission is received from the other communication device.

61. The medium of claim 28, and further comprising instructions encoded on the medium for repeating steps (a) through (c) for signals transmitted between the first and second communication devices.

* * * * *

UNITED STATES PATENT AND TRADEMARK OFFICE
CERTIFICATE OF CORRECTION

PATENT NO. : 6,785,520 B2
APPLICATION NO. : 10/174689
DATED : August 31, 2004
INVENTOR(S) : Sugar et al.

It is certified that error appears in the above-identified patent and that said Letters Patent is hereby corrected as shown below:

IN THE SPECIFICATION

At column 2, line 11, after the word "FIG." insert --5.--.

At column 3, line 46, after the word "is", delete "$P_{tx}/M$" and insert therefor --$P_{tx}/M$.--.

At column 4, line 40, after the word "value,", delete "$P_{tx}/K$" and insert therefor --$P_{tx}/K$.--.

At column 5, line 11, after the word "section", delete "420" and insert therefor --320--.

At column 5, line 17, after the word "(Rx)", delete "3 14" and insert therefor --314--.

At column 8, line 2, after the word "adder", delete "670".

At column 8, line 30, after the word "An", delete "AID" and insert therefor --A/D--.

At column 8, line 36, after the word "weights", delete "$w_r(f)$" and insert therefor --wrx(f)--.

At column 9, line 2, after the word "step", delete "610" and insert therefor --910--.

At column 9, line 10, after the word "step", delete "630" and insert therefor --930--.

IN THE CLAIMS

In claim 4, at column 11, line 49, after the word "antennas,", delete ".complex" and insert therefor --complex--.

In claim 6, at column 12, line 28, before the word "applying", delete "c." and insert therefor --e.--.

(continued ...)

UNITED STATES PATENT AND TRADEMARK OFFICE
CERTIFICATE OF CORRECTION

PATENT NO. : 6,785,520 B2
APPLICATION NO. : 10/174689
DATED : August 31, 2004
INVENTOR(S) : Sugar et al.

It is certified that error appears in the above-identified patent and that said Letters Patent is hereby corrected as shown below:

In claim 7, at column 12, line 49, after the word "step", delete "(c)" and insert therefor --(e)--.

Signed and Sealed this

Seventeenth Day of April, 2007

JON W. DUDAS
*Director of the United States Patent and Trademark Office*